US006865114B2

(12) United States Patent
Pio

(10) Patent No.: US 6,865,114 B2
(45) Date of Patent: Mar. 8, 2005

(54) WORD LINE SELECTOR FOR A SEMICONDUCTOR MEMORY

(75) Inventor: Federico Pio, Brugherio (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 10/372,626

(22) Filed: Feb. 20, 2003

(65) Prior Publication Data

US 2003/0198101 A1 Oct. 23, 2003

(30) Foreign Application Priority Data

Feb. 20, 2002 (EP) .............................. 02425084

(51) Int. Cl.$^7$ .............................................. G11C 16/04
(52) U.S. Cl. ......................... 365/185.29; 365/185.23; 365/230.06
(58) Field of Search ................. 365/185.29, 185.23, 365/230.06, 189.09, 200

(56) References Cited

U.S. PATENT DOCUMENTS

| 5,822,252 A | 10/1998 | Lee et al. |
| 5,847,994 A | 12/1998 | Motoshima et al. |
| 5,886,942 A * | 3/1999 | Akita ................. 365/230.06 |
| 5,931,563 A | 8/1999 | Jinbo |
| 6,222,774 B1 * | 4/2001 | Tanzawa et al. ....... 365/185.29 |

FOREIGN PATENT DOCUMENTS

| EP | 0 606 659 A2 | 7/1994 |
| EP | 02 42 5084 | 8/2002 |

OTHER PUBLICATIONS

Akira Umezawa et al: A S–V–ONLY Operation 0.6–UM Flash IEEPROM With Row Decoder Scheme In Triple–Wall Structure; IEEE Journal of Solid–State Circuits, IEEE Inc., New York, US, vol. 27, No. 11; Nov. 1, 1992, pp. 1540–1545, XP000320440 ISSN:0018–9200.

* cited by examiner

Primary Examiner—David Lam
(74) Attorney, Agent, or Firm—Graybeal Jackson Haley LLP

(57) ABSTRACT

A word line selector for selecting word lines of an array of semiconductor memory cells formed in a doped semiconductor region of a semiconductor substrate comprises a plurality of word line drivers responsive to word line selection signals. Each word line driver is associated with a respective word line for driving the word line to prescribed word line electric potentials, depending on an operation to be conducted on the array of memory cells, in accordance with the word line selection signal.

28 Claims, 8 Drawing Sheets

WORD LINE SELECTOR FOR A SEMICONDUCTOR MEMORY

PRIORITY CLAIM

This application claims priority from European patent application No. 02425084.7, filed Feb. 20, 2002, which is incorporated herein by reference.

TECHNICAL FIELD

The present invention relates generally to the field of semiconductor memories, particularly non-volatile memories. More particularly, the invention relates to electrically erasable and programmable non-volatile memories, such as flash memories.

BACKGROUND OF THE INVENTION

As known, data is written (programmed) to a flash memory by means of hot-electron injection into floating-gate electrodes (hereinafter, floating gates) of the memory cells. To erase the data, electrons are extracted from the floating gates of the memory cells by means of the mechanism known as Fowler-Nordheim tunnelling at high electric fields, giving rise to a Fowler-Nordheim current.

In conventional flash memories, the erase operation has a global character, affecting the whole array (also called matrix) of memory cells or, where memory sectors are provided with, a whole memory sector. All the memory cells of the matrix or memory sector to be erased are submitted to an erase voltage $$V_{GB}=V_G-V_B$$

where $V_G$ is, for example, a negative voltage (e.g., ranging from −8V to −9V) applied simultaneously to all the word lines of the matrix or memory sector, that is, to the memory cells' control-gate electrode (hereinafter, control gate), and $V_B$ is a positive voltage (e.g., ranging from 8V to 9V) applied to the common substrate or bulk electrode of the memory cells of the matrix or memory sector, that is, the (typically P-type) doped semiconductor well in which the memory cells of the matrix or memory sector are formed. Starting from a prescribed initial value, the erase voltage $V_{GB}$ is progressively increased (in absolute value) until, by progressive extraction of electrons from the memory cells' floating gates, the threshold voltage of all the memory cells is brought below a prescribed value, chosen to assure a proper margin compared to the standard memory read conditions.

The global character of the erase operation is a significant disadvantage of conventional flash memories. In fact, even if memory sectors have the minimum memory-sector size that can be practically achieved at a reasonable cost in terms of semiconductor chip area. This minimum size is still some number of KBytes. This means that when even a single data byte or word belonging to a given memory sector is to be modified, the whole memory sector, that is, some number of KBytes of memory space, must be erased and then rewritten.

This limits the otherwise highly desirable use of flash memories in those applications that require frequent modification of single data bytes or words.

As a solution to this problem, flash memories have been proposed in which, during an erase operation, only one word line (more generally, only a subset of the set of word lines making up the memory matrix or sector) is biased to a negative voltage $V_{selG}$ of, e.g., −8 V to −9 V, while the remaining word lines of the matrix or memory sector are biased to ground. In this way, only the memory cells belonging to the selected word line(s) are subjected to the erase voltage $V_{GB}$. In the memory cells belonging to the non-selected word lines, the electric field across the gate oxide thereof is substantially reduced so as not to trigger the Fowler-Nordheim tunneling.

Thanks to the above solution, which requires a suitable modification of the conventional row address decoder and row selection circuits, the flash memory can be erased with a finer granularity, equal to one word line (or a subset of word lines) instead of the whole matrix or sector. Defining a "memory page" as the elementary memory unit that can be individually erased, that is, one word line (or a subset of word lines), the memory can be referred to as a "Page Erasable ROM" or "PEROM".

A problem affecting the PEROM is that when a memory page is to be erased, the memory cells not belonging to that memory page, but belonging to the same memory sector, (or to the memory matrix, if no memory sectors are provided) are disturbed. In fact, even if the gate-bulk voltage $-V_B$, to which such memory cells are subjected, is not sufficient to erase them, such a voltage is, however, still favorable to the extraction of electrons from the floating gates thereof, and, thus, to a small reduction of the their threshold voltages. Considering that any given memory page can be erased and rewritten many thousands of times, some memory cells, even if not belonging to the word line(s) to be erased, may, at a given time, loose the datum stored therein.

SUMMARY OF THE INVENTION

In view of the state of the art described, an embodiment of the present invention overcomes the problem of affecting the unerased memory cells during an erase operation.

The word line selector according to an embodiment of the present invention allows selecting word lines of an array of semiconductor memory cells formed in a doped semiconductor region of a semiconductor substrate.

The word line selector comprises a plurality of word line drivers responsive to word line selection signals. Each word line driver is associated with a respective word line for driving the word line to prescribed word line electric potentials according to the word line selection signal, said word line electric potentials depending on an operation to be conducted on the array of memory cells.

A plurality of distinct doped semiconductor well structures is provided in the semiconductor substrate: each doped semiconductor well structure accommodates a respective group of at least one word line driver associated with a respective group of at least one word line.

By providing separate doped semiconductor well structures for different groups of word line drivers, the electric potentials applied to word lines belonging to different word line groups can be completely uncorrelated. In particular, in an erase operation, the word lines belonging to word line groups different from the one including the word line to be erased can, thus, be biased to a suitable erase inhibition potential, sufficient not only to prevent the erasure, but also to avoid affecting the data stored in the memory cells not to be erased.

BRIEF DESCRIPTION OF THE DRAWINGS

The features and advantages of the present invention will be made apparent by the following detailed description of some embodiments thereof, illustrated merely by way of non-limiting examples in the annexed drawings, wherein.

DETAILED DESCRIPTION

Figure 1:
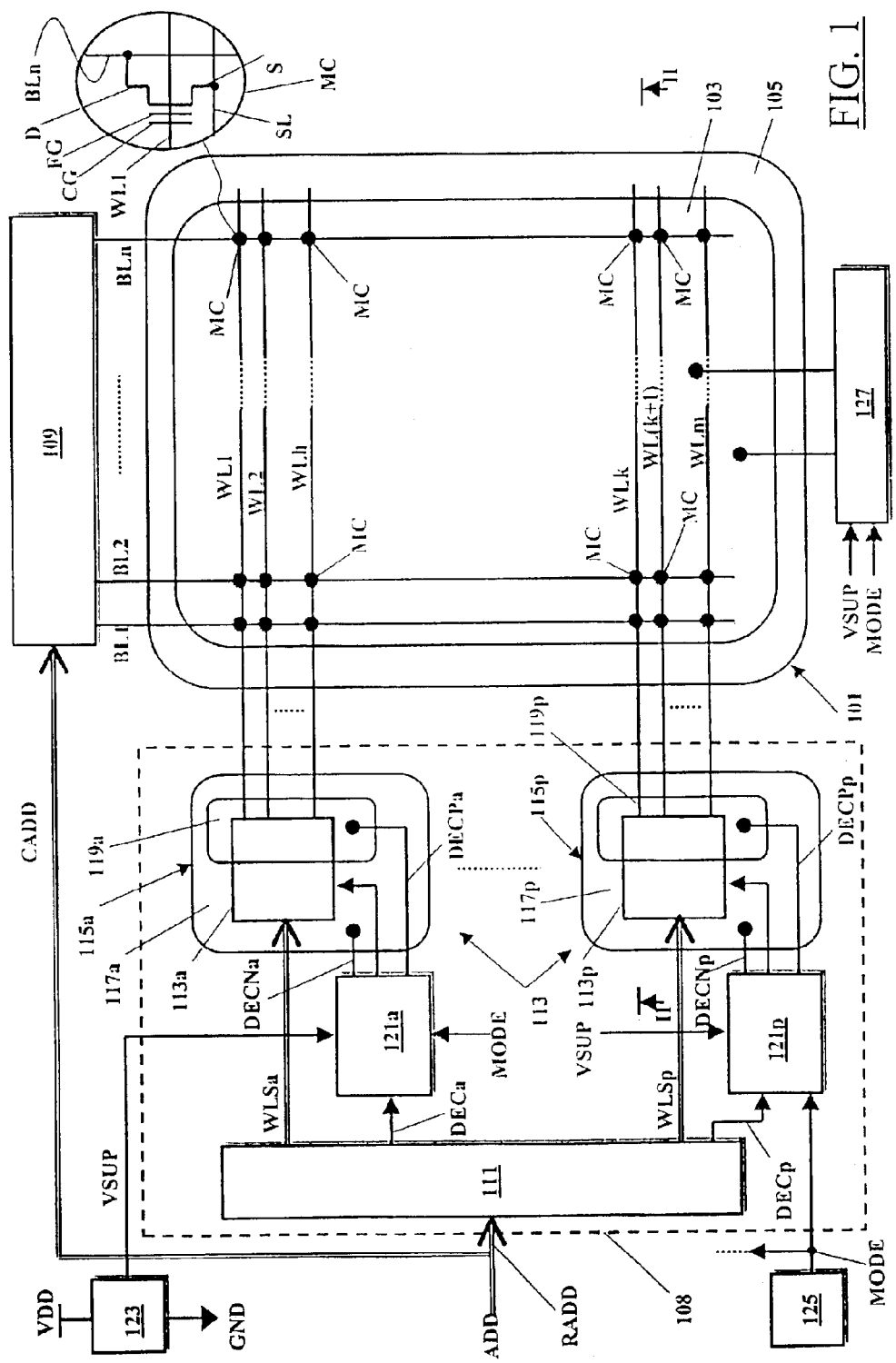
FIG. 1 is a schematic diagram of a memory with a word line selector according to an embodiment of the present invention, having a plurality of word line driver blocks formed in distinct doped semiconductor well structures of a semiconductor substrate.

With reference to the drawings, FIG. 1 schematically shows a memory with a word line selector according to an embodiment of the present invention. The memory comprises a two-dimensional array 101 of memory cells MC (depicted for simplicity as dots) arranged by rows (word lines) WL1, WL2, . . . , WLh, . . . , WLk, WL(k+1), . . . , WLm and columns (bit lines) BL1, BL2, . . . , BLn.

The memory cells MC are conventionally formed by stacked-gate MOS transistors with a control gate CG connected to the respective word line, an electrically insulated floating gate FG, a drain D connected to the respective bit line, and a source S connected to a source line common to all the memory cells of the array 101.

Figure 2:
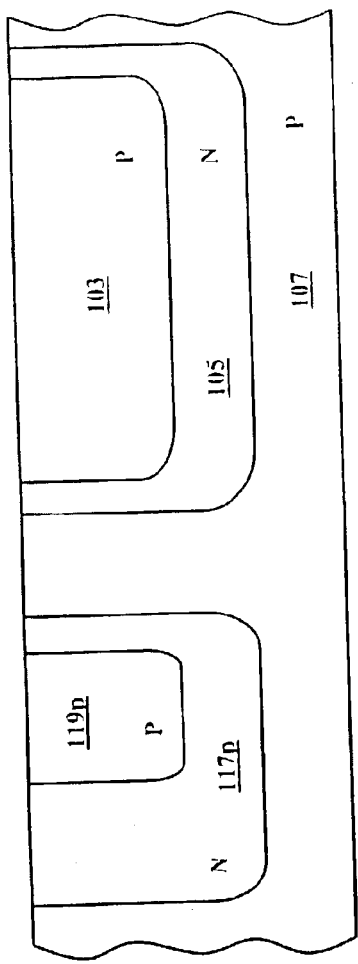
FIG. 2 is a simplified cross-sectional view, along the plane II—II in FIG. 1, of a portion of an integrated circuit chip in which the memory of FIG. 1 is integrated according to an embodiment of the present invention.

Referring jointly to FIGS. 1 and 2, the memory cells MC are formed within a semiconductor well 103 of a first conductivity type, for example of the P-type for N-channel memory cells; the first-conductivity-type semiconductor well 103 is formed within a semiconductor well 105 of a second conductivity type, particularly of the N-type in the shown example. The second-conductivity-type semiconductor well 105 is in turn formed in a semiconductor substrate 107 of a first conductivity type, particularly of the P-type in the shown example.

The memory comprises a word line selector 108 for selecting the word lines WL1–WLm. The word line selector 108 receives row address signal lines RADD from a bus ADD of address signal lines. The address signal line bus ADD carries address signals for selecting memory storage locations; the address signals can either be supplied to the memory by external circuits, such as a microprocessor (not shown in the drawings) or a memory controller (not shown in the drawings), or be generated internally to the memory, for example by a counter (not shown in the drawings). The word line selector 108 decodes a digital code carried by the row address signal lines RADD and accordingly selects one word line among the plurality of word lines WL1–WLm. The word line selector 108 biases the selected word line and the non-selected word lines to respective prescribed electric potentials, which depend on the memory operation mode (read, program, erase).

The memory also comprises a bit line selector 109. The bit line selector 109 receives column address signal lines CADD from the address signal lines bus ADD. The bit line selector 109 allows selecting one bit line among the plurality of bit lines BL1—BLn, or a group of, e.g., eight or sixteen bit lines, depending on the degree of parallelism of the memory. The selected bit line is electrically coupled to a sensing circuitry, including conventional sense amplifiers, for sensing the memory cells, or to a programming circuitry for programming the memory cells, depending on the memory operation mode (read, program). The sensing circuitry and the programming circuitry are per-se conventional and are therefore not described in greater detail.

The word line selector 108 comprises a row address decoder circuit section 111 and a word line driver circuit section 113. The row address decoder circuit section 111 decodes the digital code carried by the row address signal lines RADD. The word line driver circuit section 113 drives the word lines to the respective prescribed electric potentials according to the result of the row address decoding operation performed by the row address decoder circuit section 111.

The word line driver circuit section 113 is made up of a plurality of word line driver circuit blocks 113a–113p. Each word line driver circuit block 113a–113p is associated with a respective group of word lines of the array 101. Only two word line driver circuit blocks 113a, 113p are shown in the drawing for simplicity. The word driver circuit block 113a is associated with the group of word lines WL1 to WLh, and the word line driver circuit block 113p is associated with the group of word lines WLk to WLm. Each word line driver circuit block 113a–113p receives, from the row address decoder circuit section 111, a respective group WLSa–WLSp of word line selection control signal lines. The logic state on the word line selection control signal lines of each group WLSa–WLSp determines the selection or the deselection of the word lines of the corresponding word line group.

Referring, once again, jointly to FIGS. 1 and 2, each word line driver circuit block 113a–113p is formed in a respective complementary doped semiconductor well structure 115a–115p distinct from the doped semiconductor well structures in which the other word line driver circuit blocks are formed. Each doped semiconductor well structure 115a–115p comprises a doped semiconductor well 117a–117p of a second conductivity type, particularly of the N type in the shown example, formed in the semiconductor substrate 107. Within the second-conductivity-type semiconductor well 117a–117p a respective doped semiconductor well 119a–119p of a first conductivity type, particularly of the P type in the shown example, is formed. The first-conductivity-type semiconductor well 119a–119p accommodates second-conductivity-type-channel MOSFETs (N-channel MOSFETs, in the shown example) of the respective word line driver circuit block, and the second-conductivity-type semiconductor well 117a–117p accommodates first-conductivity-type-channel MOSFETs (P-channel MOSFETs, in the shown example) of the respective word line driver circuit block. It is to be observed that the first-conductivity-type semiconductor well 119a–119p that is formed in a given second-conductivity-type semiconductor well 117a–117p needs not be physically continuous, that is, more than one first-conductivity-type semiconductor well 119a–119p might be formed within a respective second-conductivity-type semiconductor well 117a–117p.

Similarly, the second-conductivity-type semiconductor well 117a–117p of a given doped semiconductor well structure may be physically made up of several wells.

Also, schematically shown in FIG. 1 as blocks 121a–121p, are bias control circuits for biasing the doped semiconductor well structures 115a–115p and for supplying the word line driver circuit blocks 113a–113p with suitable supply voltages. Each bias control circuit 121a–121p controls a respective word line driver circuit block 113a–113p and the doped semiconductor well structure 115a–115p in which the respective word line driver circuit block is formed. In particular, the bias control circuits 121a–121p bias the first- and second-conductivity-type semiconductor wells 119a–119p and 117a–117p of each doped semiconductor well structure 115a–115p to respective, prescribed electric potentials, which depend on the memory operation mode.

Each bias control circuit 121a–121p receives a plurality of different electric potentials through voltage supply lines schematically indicated by a line VSUP in FIG. 1. The different electric potentials are generated internally to the memory by circuits schematized as a block 123, including, for example, positive and negative charge pumps. For example, the circuits in the block 123 generates the different electric potentials starting from two supply voltages VDD and GND supplied to the memory (in which case the memory can be referred to as a Single Power Supply or SPS device).

The memory includes control circuits schematized by a block 125 for controlling the memory operating mode; operating mode control signals identified altogether by a line MODE are supplied to the bias control circuits 121a–121p.

The bias control circuits 121a–121p also receive, from the row address decoder circuit section 111, word line group selection signals DECa–DECp. One of the word line group selection signals DECa–DECp is asserted when a word line belonging to the respective group of word lines WL1–WLh, . . . , WLk–WLm is selected.

The memory also comprises circuits, schematized in FIG. 1 as a block 127, for biasing the semiconductor wells 103 and 105 in which the array of memory cells MC is formed, according to the memory operating mode.

Figure 3:
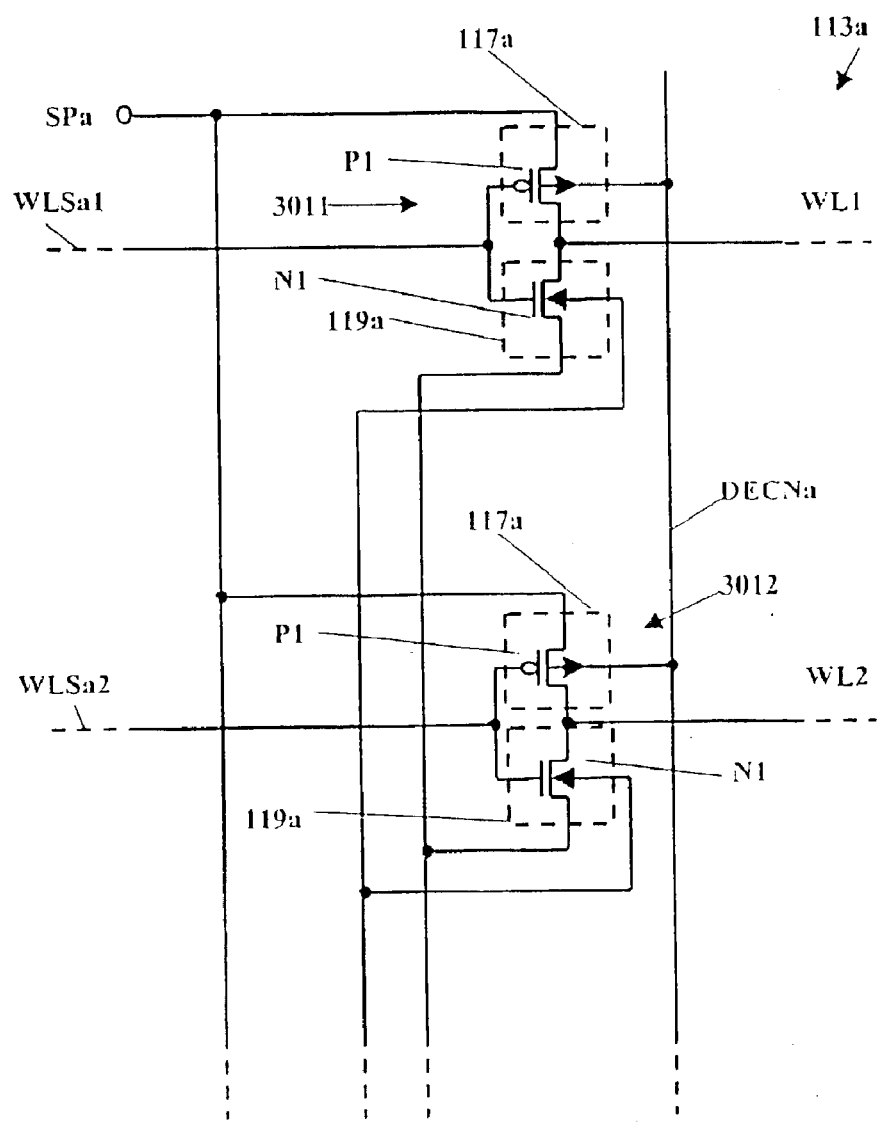
FIG. 3 is a circuit diagram of a word line driver block according to an embodiment of the invention.

Reference is now made to FIG. 3, wherein a circuit diagram is shown of a word line driver circuit block 113a of the plurality of word line driver circuit blocks 113a–113p according to an embodiment of the invention. The word line driver circuit block 113a comprises a plurality of word line driver circuits 3011, 3012, . . . equal in number to the number of word lines of the respective group of word lines WL1–WLh. Only two word line driver circuits 3011 and 3012 are shown for simplicity. Each word line driver circuit 3011, 3012, . . . of a word line driver circuit block 113a drives a respective word line of the group of word lines associated with the word line driver circuit block 113a.

Each word line driver circuit 3011, 3012 comprises a P-channel MOSFET P1 and an N-channel MOSFET N1 connected in series to each other in a CMOS inverter configuration between a first supply voltage line SPa and a second supply voltage line DECSa, which are common to all the word line driver circuits of the word line driver circuit block 113a. The P-channel and N-channel MOSFETs P1 and N1 are controlled by a word line selection signal carried by a word line selection signal line WLSa1, WLSa2, . . . belonging to the respective group of word line selection signal lines WLSa. An output of the CMOS inverter P1, N1 is connected to a respective word line WL1, WL2, . . . of the group of word line WL1–WLh.

A given word line is selected when the voltage of the respective word line selection signal line is such as to turn the P-channel MOSFET P1 on, thereby the word line potential is brought to that of the first supply voltage line SPa. The word line is deselected when the voltage of the respective word line selection signal line is such as to turn the N-channel MOSFET N1 on, whereby, the word line potential is brought to that of the second supply voltage line DECSa.

The P-channel MOSFETs P1 of all the word line driver circuits 3011, 3012 of a same word line driver circuit block 113a–113p are formed within the N-type semiconductor well 117a–117p of the respective doped semiconductor well structure 115a–115p. The N-channel MOSFETs N1 of all the word line driver circuits 3011, 3012 of a same word line driver circuit block 113a–113p are formed within the P-type semiconductor well 119a–119p of the respective doped semiconductor well structure 115a–115p.

The first and second supply voltage lines SPa–SPp and DECSa–DECSp of each word line driver circuit block 113a–113p are controlled by the respective bias control circuit 121a–121p. The bias control circuits 121a–121p also control the biasing of the associated N-type and P-type semiconductor wells 117a–117p and 119a–119p to the prescribed electric potentials, as will be discussed in detail below, through respective doped semiconductor well bias voltage lines DECNa–DECNp and DECPa–DECPp.

Figure 4:
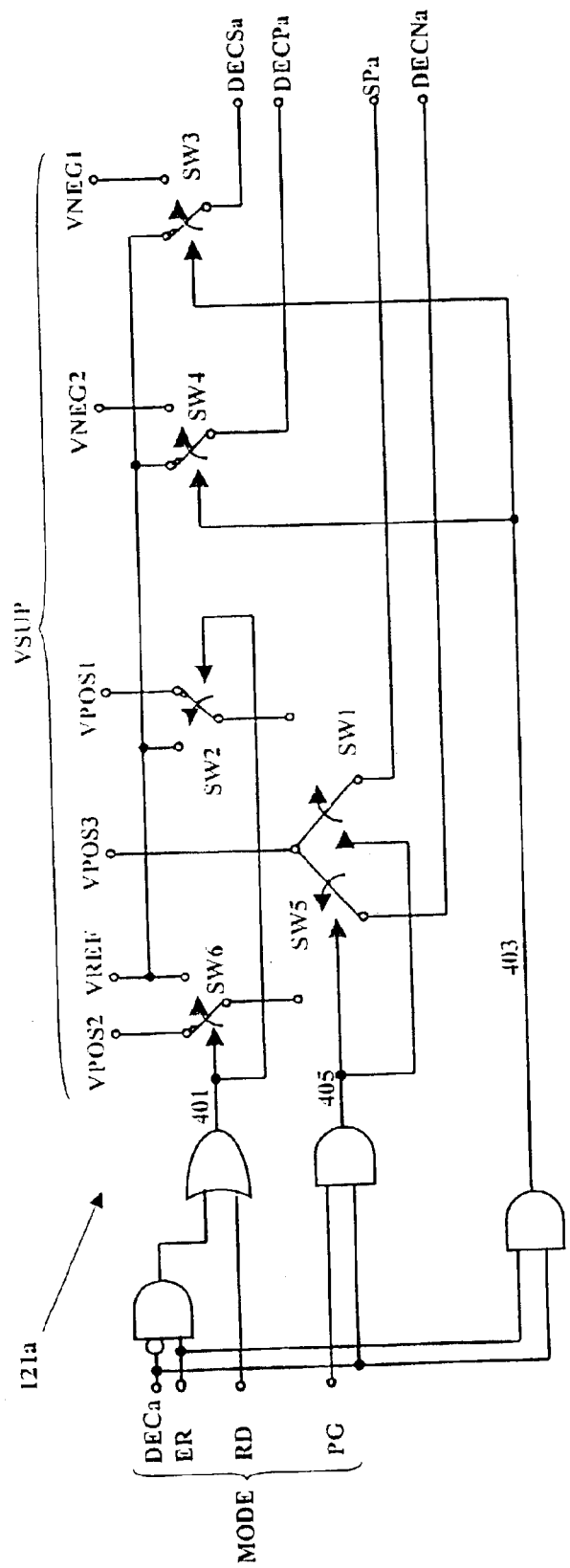
FIG. 4 is a schematic diagram of a bias control circuit according to an embodiment of the present invention, associated with the word line driver block of FIG. 3.

FIG. 4 is a schematic diagram of a bias control circuit 121a of the plurality of bias control circuits 121a–121p according to an embodiment of the present invention.

The bias control circuit 121a receives from the internal voltage generator 123 six different potentials, namely: a reference potential VREF, for example, equal to the ground voltage GND externally supplied to the memory; a first positive potential VPOS1, for example, equal to 4.5 V; a second positive potential VPOS2, for example, equal 5 V; a third positive potential VPOS3, for example, equal to 8.5 V; a first negative potential VNEG1, for example, equal to –8 V; and a second negative potential VNEG2, for example, equal to –9 V. The operating mode control signals MODE include a read mode signal RD asserted when the memory is operated in read mode, a program mode signal PG asserted when the memory is operated in program mode, and an erase mode signal ER asserted when the memory is operated in erase mode.

It is pointed out that all the electric potential values are to be intended as merely exemplary and not at all limiting.

The first voltage supply signal line SPa of the word line driver circuits of the word line driver circuit block 113a can be selectively switched to the reference potential VREF, the first positive potential VPOS1 and the third positive potential VPOS3. A first switch SW1, controlled by a signal 405 which is asserted when the program mode signal PG is asserted and the word line group selection signal DECa is asserted, connects the first voltage supply signal line SPa to the third positive potential VPOS3 when the memory is in program mode and the word line to be programmed belongs to the word line group associated with the bias control circuit 121a. When the memory is not in program mode or the word line to be programmed does not belong to the word line group associated with the bias control circuit 121a, the first switch SW1 connects the first voltage supply line SPa to an output of a second switch SW2 switchable between the reference potential VREF and the first positive potential VPOS1. The second switch SW2 is controlled by a signal 401 which is asserted when the memory is in read mode(read mode signal RD asserted) or when the memory is in erase mode (erase mode signal ER asserted) but the group of word lines associated with the bias control circuit 121a is not selected (signal DECa is deasserted); when signal 401 is asserted, the second switch SW2 is turned to the first positive potential VPOS1, otherwise the second switch SW2 is turned to the reference potential VREF.

The second voltage supply signal line DECSa of the word line driver circuits of the word line driver circuit block 113a can be selectively switched between the reference potential VREF and the first negative potential VNEG1. A third switch SW3 controlled by a signal 403 allows to connect the second voltage supply signal line DECSa to the reference potential VREF unless the memory is in erase mode (erase mode signal ER asserted) and the group of word lines associated with the bias control circuit 121a is selected (signal DECa asserted), in which case the second voltage supply signal line DECSa is connected to the first negative potential VNEG1.

The P-well bias signal line DECPa can be selectively switched between the reference potential VREF and the second negative potential VNEG2, through a fourth switch SW4 controlled by the signal 403. The P-well bias signal line DECPa is connected to the reference potential VREF unless the memory is in erase mode (signal ER asserted) and the group of word lines associated with the bias control circuit 121a is selected (signal DECa asserted), in which case the P-well bias signal line DECPa is connected to the second negative potential VNEG2.

The N-well bias signal line DECNa can be selectively switched to the reference potential VREF, the second positive potential VPOS2 and the third positive potential VPOS3. A fifth switch SW5, controlled by the signal 405 connects the N-well bias signal line DECNa to the third positive potential VPOS3 when the program mode signal PG is asserted, i.e., when the memory is in program mode, and the word line to be programmed belongs to the word line group associated with the bias control circuit 121a. When the memory is not in program mode or the word line to be programmed does not belong to the word line group associated with the bias control circuit 121a, the fifth switch SW5 connects the N-well bias signal line DECNa to an output of a sixth switch SW6 switchable between the reference potential VREF and the second positive potential VPOS2. The sixth switch SW6 is controlled by the signal 401, so as to connect the N-well bias signal line DECNa to the second positive potential VPOS2 when the memory is in read mode (read mode signal RD asserted) or when the memory is in erase mode (erase mode signal ER asserted) but the group of word lines associated with the bias control circuit 121a is not selected (signal DECa is deasserted), and to the reference potential VREF when the memory is in erase mode and the word line to be erased belongs to the word line group associated with the bias control circuit 121a.

Other embodiments of the bias control circuits 121a–121p are clearly possible.

Figure 5A:
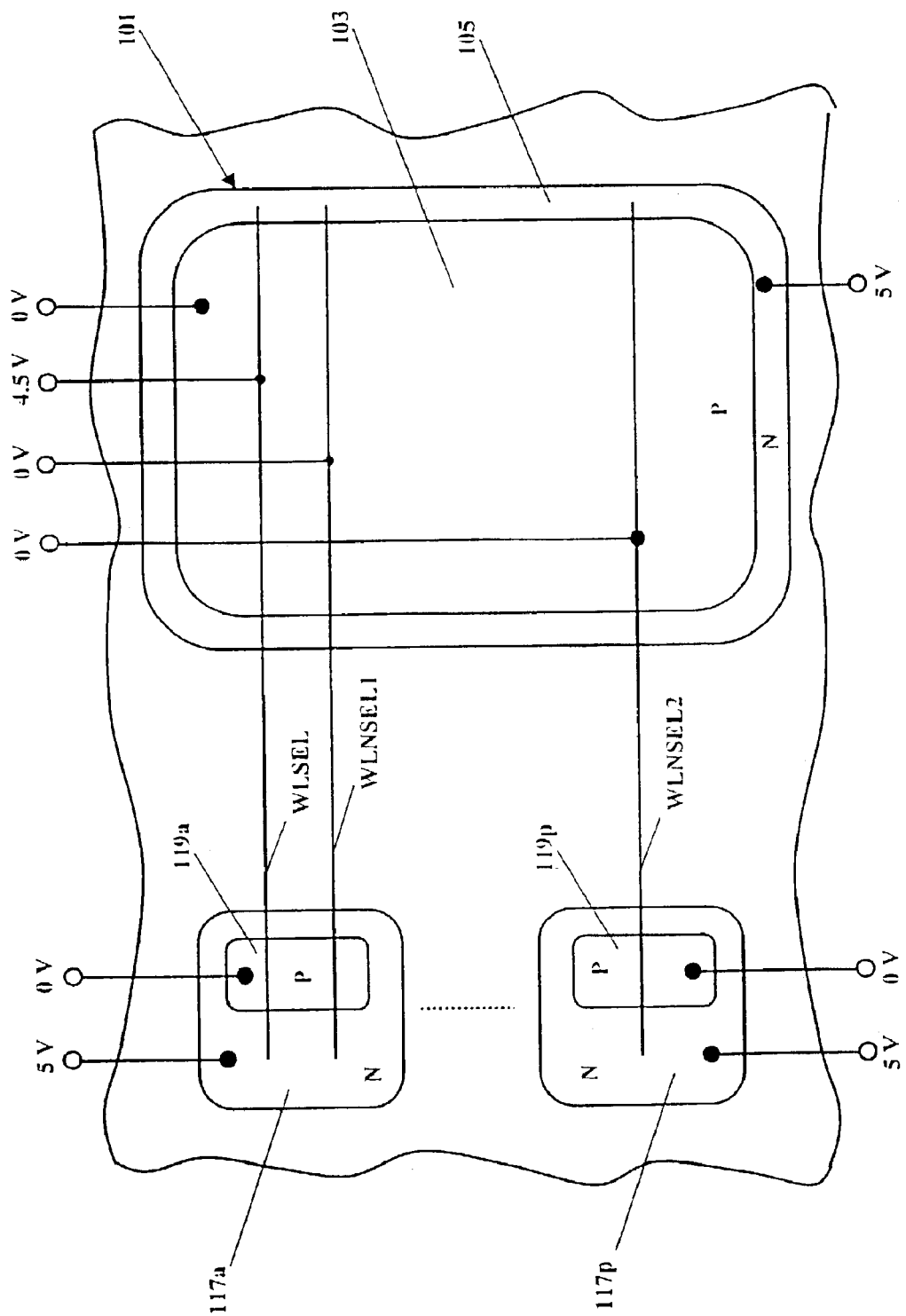
FIGS. 5A, 5B and 5C schematically show exemplary electric potentials applied to the word lines and to the doped semiconductor well structures in read, program and erase memory operating modes, respectively, according to an embodiment of the present invention.
Figure 5B:
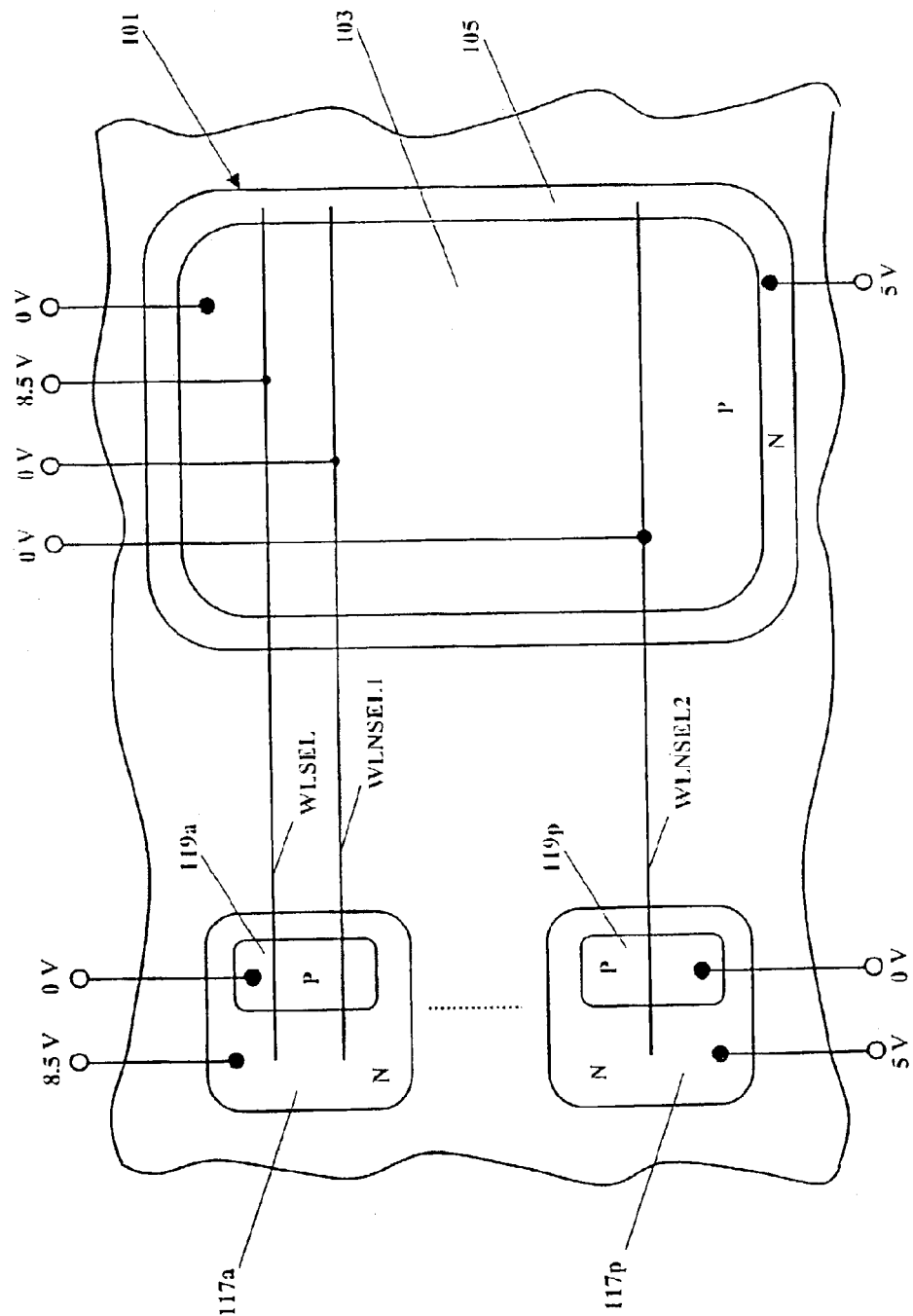
Figure 5C:
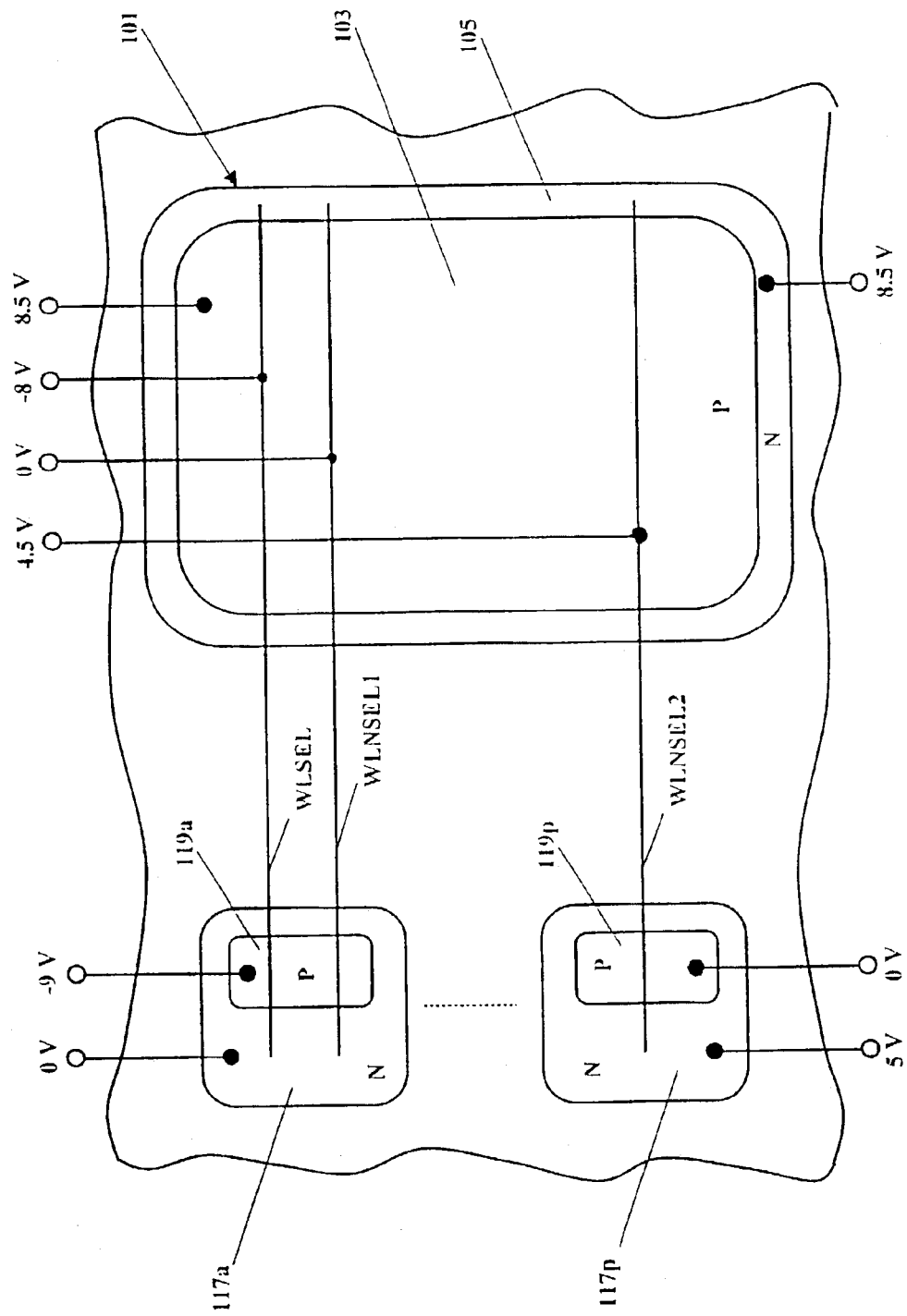

FIGS. 5A, 5B and 5c schematically show the exemplary electric potentials described above applied to the N-type and P-type wells of the word line selector and of the array of memory cells, as well as to the word lines, in the read, program and erase operating modes, respectively.

Referring first to FIG. 5A, when the memory is in the read operating mode, all the N-type semiconductor wells 117a–117p are biased to the second positive potential VPOS2, e.g. 5 V; all the P-type semiconductor wells 119a–119p are biased to the reference potential VREF (0 V).

The P-type well 103 in which the memory cells MC are formed is biased to the reference potential VREF, and the N-type well 105 is biased to the second positive potential VPOS2 (5 V). The selected word line WLSEL is biased to the first positive potential VPOS1, e.g., 4.5 V; the remaining, non-selected word lines WLNSEL1, WLSEL2 are kept at the reference potential VREF, irrespective of the word line group to which they belong.

Referring now to FIG. 5B, in the program operating mode, at least the N-type semiconductor well 117a associated with the word line selected for programming is biased to the third positive potential VPOS3, e.g., 8.5 V, while all the other N-type semiconductor wells 117 are biased to the same positive potential used in the read operating mode, i.e., the second positive potential VPOS2 (5 V); alternatively, all the N-type semiconductor wells 117a–117p are biased to the third positive potential VPOS3. All the P-type semiconductor wells 119a–119p are biased to the reference potential VREF. The P-type well 103 in which the memory cells MC are formed is biased to the reference potential VREF, and the N-type well 105 is biased to the second positive potential VPOS2. Alternatively, the P-type well 103 could be biased to a slightly negative potential, e.g., ranging from −1 V to −2 V. The word line WLSEL selected for programming is biased to the third positive potential VPOS3 (8.5 V), while all the other, non-selected word lines WLNSEL1, WLNSEL2 are biased to the reference potential VREF, irrespective of the word line group to which they belong.

Finally, referring to FIG. 5C, when the memory is in the erase operating mode the P-type well 103 in which the memory cells MC are formed and the N-type well 105 are biased to the third positive potential VPOS3 (8.5 V). Assuming that the word line WLSEL selected for being erased belongs to the group of word lines WL1–WLh, the N-type semiconductor well 117a is biased to the reference potential VREF, and the P-type semiconductor well 119a is biased to the second negative potential VNEG2 (−9 V). The word line WLSEL to be erased is biased to the first negative potential VNEG1 (−8 V), while all the other, non-selected word lines WLNSEL1 of the same group WL1–WLh are biased to the reference potential VREF. All the other N-type semiconductor wells (such as the N-type semiconductor well 117p in the drawing) are biased to the second positive potential (5 V), and the respective P-type semiconductor wells (such as the P-type well 119p in the drawing) are biased to the reference potential VREF. The non-selected word lines WLNSEL2 belonging to the other groups of word lines are biased to the first positive potential VPOS1 (4.5 V).

In this way, the memory cells MC belonging to the selected word line WLSEL are submitted to an erase voltage $$V_{SelGB}=V_G-V_B=-8\ V-8.5\ V=-16.5\ V$$

suitable for causing the erasure of the programmed memory cells by Fowler-Nordheim tunneling. The memory cells belonging to the non-selected word lines WLNSEL2 of the other word line groups are submitted to a gate-to-bulk voltage equal to $$V_{deselGB}=4.5\ V-8.5\ V=-4\ V,$$

which is not sufficient to either erase or disturb the programmed memory cells. The memory cells belonging to the other, non-selected word lines WLSEL1 of the same word line group as the selected word line WLSEL are submitted to a gate-to-bulk voltage equal to −8.5 V.

Preferably, the positive potential VPOS3 (8.5 V) is applied to the P-type well 103 progressively, for example, ramping up the voltage applied to the P-type well 103 from an initial value of 3 or 4 V to the full 8.5 V. This avoids a peak in the Fowler-Nordheim current.

It is to be observed that, if needed, the memory cells of the non-selected word lines of word line groups different from that containing the selected word line could be biased to a potential even higher than 4.5 V, e.g., up to the positive potential to which the P-type well 103 is biased (8.5 V). To this purpose, it suffices to bias the P-type and N-type wells in which the respective word line drivers are formed to 0 V and 8.5 V, respectively, and connecting the respective first voltage supply lines to the 8.5 V potential.

Thanks to this, only the relatively few word lines belonging to the same group of word lines as the word line to be erased can be disturbed during the erasure of the selected word line. All the remaining word lines, being biased to a positive potential, are not disturbed by the erase operation.

Preferably, a refresh procedure of the memory cells of the word lines belonging to the same group as the erased word line is provided, so as to avoid losing the data stored in these memory cells.

In other words, having provided separate doped semiconductor wells for different groups of word line drivers, the electric potentials applied to word lines belonging to different word line groups can be completely uncorrelated. In the erase mode, it is thus possible to bias the word lines not to be erased and belonging to different word line groups to an erase inhibition potential, intermediate between the reference potential and the potential of the P-type well 103 in which the memory cells are formed, or even equal to the potential of the P-type well 103. This would not be feasible should the word line drivers be formed in a same semiconductor well structure, since the MOSFETs of the word line driver circuits would incur breakdown, because a word line driver would have to withstand high negative potentials for the selected word line and high positive erase inhibition potentials for the non-selected word lines.

In an alternative embodiment, more than one word line could be simultaneously selected for erasing: this depends on how fine an erase granularity is desired for the memory. The word lines to be simultaneously erased may belong to a same word line group or even to different word line groups; clearly, in the latter case more memory cells may be disturbed during the erase operation.

In order to disturb the least possible number of memory cells during an erase operation, each word line group should contain the minimum possible number of word lines. In principle, every word line driver circuit could be formed within a respective doped semiconductor well structure, physically separated from the doped semiconductor well structures of the other word line driver circuits. In this way, all the word lines except the one selected for erasure could be biased to the erase inhibition potential. This, however, would have a non-negligible impact on the overall chip area occupied by the word line selector. On the other hand, the number of word lines of a given group should not be too high, so as not to excessively lengthen the time required for refreshing the memory cells of the word line group. The number of word lines in each group can, thus, be determined as a trade off between the chip area overhead and the time required to refresh the memory cells of a given word line group.

In any case, as far as the number of word lines in a word line group is significantly smaller than the overall number of word lines of the array, the memory can implement a refresh procedure according to which all the memory cells of a given word line group are refreshed each time a word line of the word line group is erased. This is clearly advantageous compared to refresh procedures in which memory cells are refreshed only on a periodical basis.

Another advantage of this embodiment of the present invention is the increase in the memory endurance even when no data refresh schemes are implemented. Compared to a memory equipped with a conventional word line selector, the number of erasure-induced disturbances to which the memory cells of any word line of the array are subject is reduced by a factor equal to the number of word line groups.

It is pointed out that the word lines belonging to a same word line group need not be physically adjacent. For example, space optimization and signal line routing considerations could lead to a layout arrangement such that word line driver circuits formed in a same complementary doped semiconductor well structure drive alternate word lines of the array.

More generally, the memory may comprise two or more arrays 101, of equal or different size, each one formed in a respective P-type well 103. Each array forms a memory sector, and has associated therewith a respective word line selector.

Figure 6:
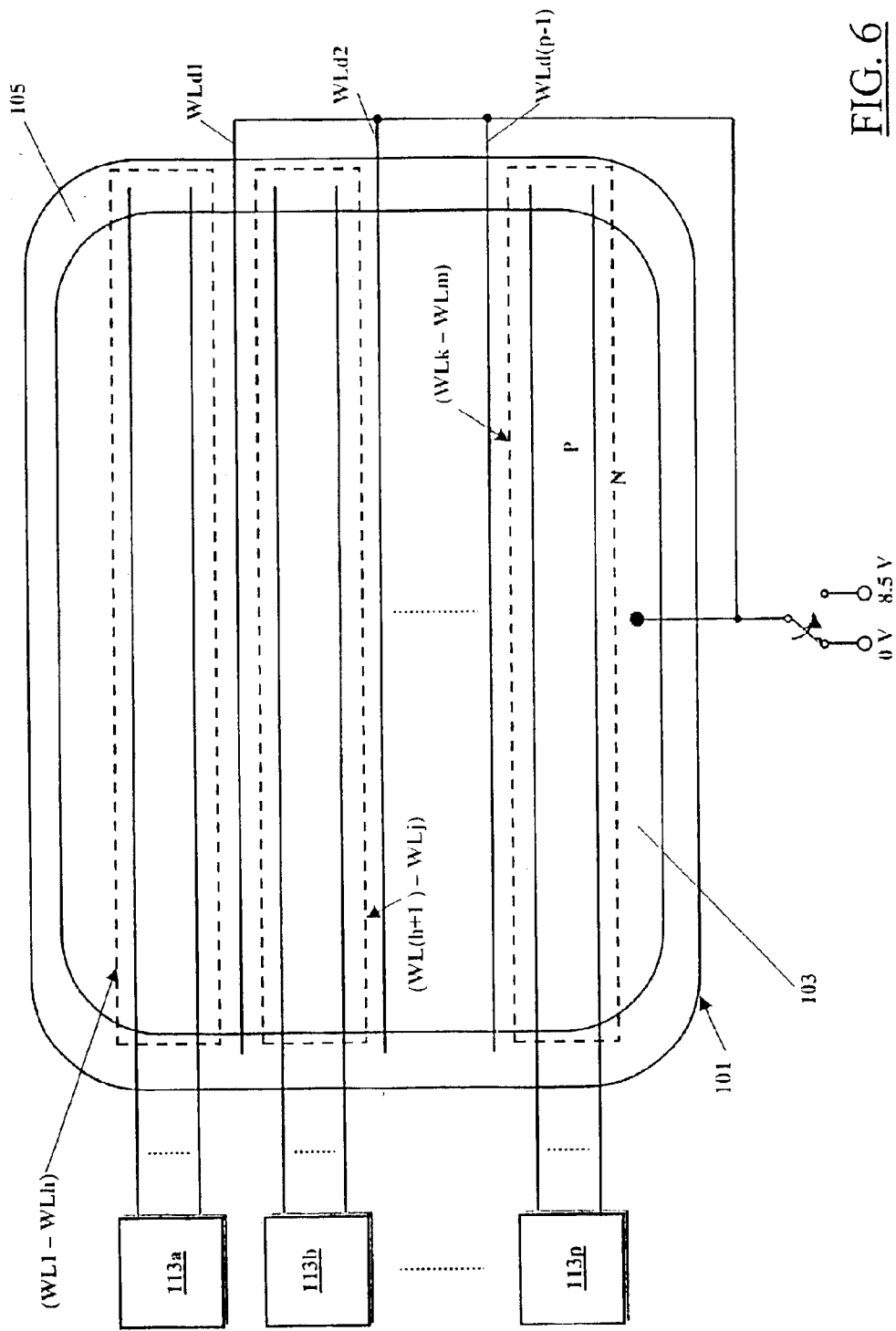
FIG. 6 schematically shows an embodiment of a memory having a word line selector according to an embodiment of the present invention.

It can be appreciated that according to an embodiment of the present invention, a situation may arise that while one word line is biased to a negative potential, an adjacent word line is biased to a positive potential (the erase inhibition potential). Specifically, this situation may be encountered when the word line to be erased (which is biased to the negative potential) is at the edge of a word line group. In this case, the electric field across the memory cells belonging to the two adjacent word lines can be excessively high. FIG. 6 schematically shows a memory cell array embodiment that avoids this problem. At least one dummy word line WLd1–WLd(p–1), not belonging to any of the word line groups, is inserted in the memory cell array between adjacent word line groups (WL1–WLh), (WL(h+1)–WLj), . . . , (WLk–WLm). The dummy word lines WLd–WL(p–1) can for example be biased to the same electric potentials as the P-type well 103, which means that, according to the example provided above, both the potential of the P-type well 103 and that of the dummy word lines WLd1–WLd(p–1) can be selectively switched between 0 V and 8.5 V, depending on the memory operating mode. Preferably, for preserving the array symmetry, a pair of dummy word lines are inserted between each pair of adjacent word line groups.

An embodiment of the present invention also sets forth a new scheme of memory sectorization. The different word line groups can be viewed as different "logical" memory sectors. Memory cells belonging to a same logical memory sector can be erased independently from the other logical memory sectors. Thus, all the word lines of a logical memory sector are, for this purpose, biased to the erase potential (by selecting all the word lines of the word line group), while the word lines of the other logical memory sectors are biased to the erase inhibition potential.

Conventional memory sectorization schemes call for forming different memory cell arrays in physically distinct and isolated P-type wells 103, with a bit line structure made up of main bit lines common to the whole memory and local bit lines local to each memory sector, and switches for selectively connecting the local bit lines to the main bit lines. Compared to this, the sectorization scheme according to the above-described embodiment of the present invention allows reducing the semiconductor chip area, because a single memory cell array can be formed in a unique semiconductor well. Area is also saved since there is no necessity of introducing main bit lines and local bit lines and corresponding switches.

Possible problems of soft-erasure of memory cells by drain stress during the programming phase (due to the fact that no electrical separation exists for cells belonging to a same bit line but to different logical sectors) can be solved by implementing a refresh procedure, providing for a periodic verification of the memory cell's content and, if necessary, reprogramming the memory cells that have partially lost charge.

Figure 7:
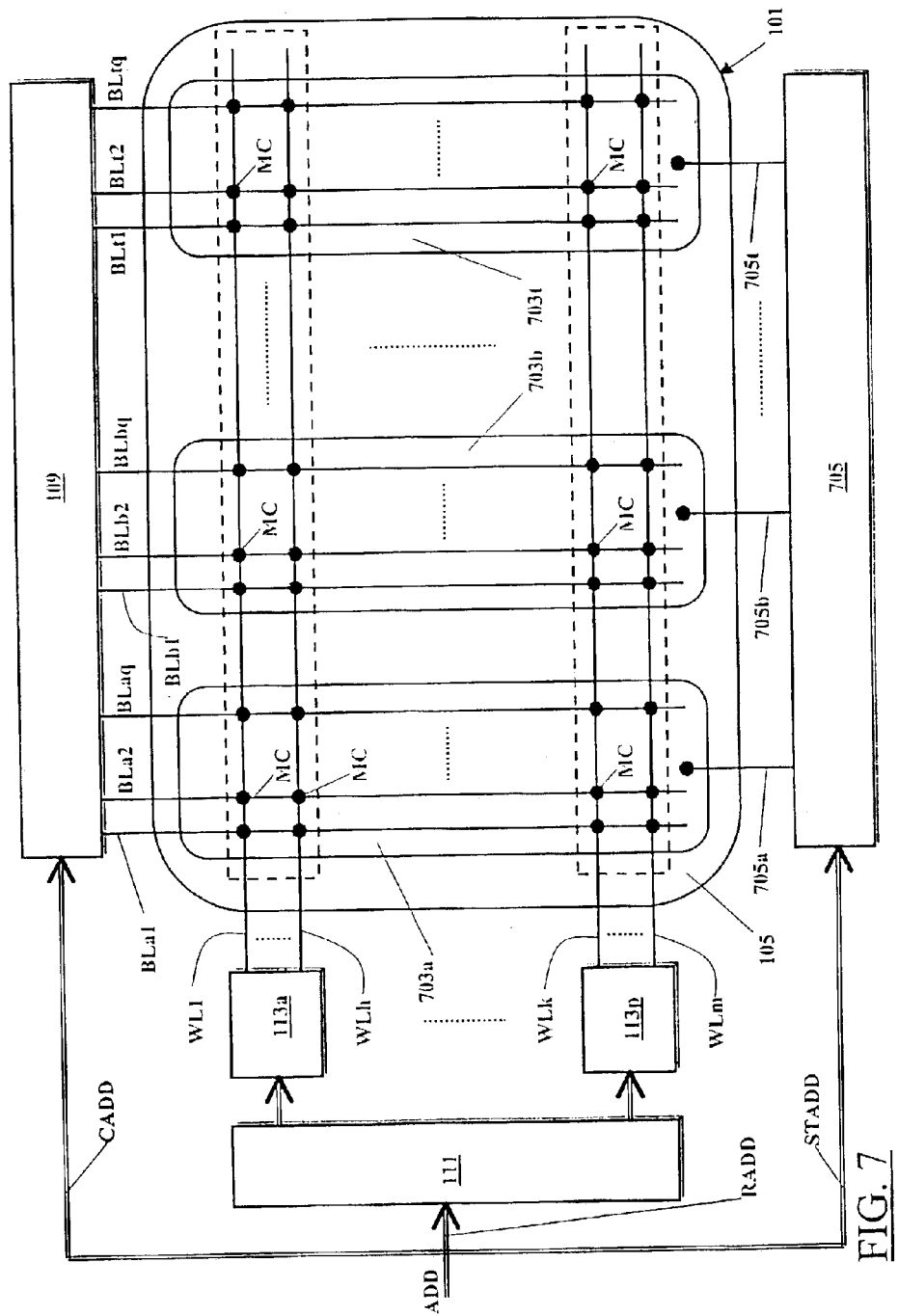
FIG. 7 schematically shows another embodiment of a memory in which the word line selector according to an embodiment of the present invention can be used.

FIG. 7 schematically shows another embodiment of memory in which the word line selector according to an embodiment of the present invention can advantageously be used. Differently from the embodiment shown in FIGS. 1 and 6, wherein the memory cells MC of the array 101 are all formed in the same P-type well 103, a plurality of P-type doped semiconductor stripes 703a–703t is provided. The P-type stripes 703a–703t extend within the N-type well 105 parallelly to the columns of memory cells and thus transversally to the array word lines WL1–WLm. Different groups of bit lines BLa1–BLaq, BLb1–BLbq, . . . , BLt1–BLtq are thus formed: each bit line group includes the bit lines whose memory cells are formed in a same P-type stripe 703a–703t. A P-type stripe bias circuit 705 is provided; the P-type stripe bias circuit 705, on the basis of a P-type stripe address carried by P-type address signal lines STADD derived from the address signal line bus ADD, allows selectively biasing the P-type stripes 703a–703t through P-type stripe bias lines 705a–705t. The provision of the plurality of P-type stripes 703a–703t allows submitting to erasure selected portions of a word line of memory cells, instead of a whole word line. The P-type stripe in which the memory cells of the selected portion of word line are formed is biased as in FIG. 5C to a positive potential of, e.g., 8.5 V, while the remaining P-type stripes are kept to ground. In this way, an even finer erase granularity is achieved. This array structure, in conjunction with the word line selector according to an embodiment of the present invention, allows further limiting of the number of memory cells possibly disturbed during an erase operation. Only the memory cells of the same word line group WL1–WLh, . . . , WLk–WLm as the selected word line and formed in the same P-type stripe as the memory cells of the selected word line portion are possibly disturbed.

Also, in this case, dummy word lines are preferably provided between adjacent word line groups.

Although in the foregoing description reference has been made to memory cells having the structure of stacked-gate transistors, the present invention also applies to other types of memory cells, such as memory cells in which the floating gate is replaced by a charge trapping layer in the cell dielectric under the control gate, for example, a nitride layer in an oxide-nitride-oxide layer stack.

The present invention has been disclosed and described by way of some embodiments, however it is apparent to those skilled in the art that several modifications to the described embodiments, as well as other embodiments of the present invention are possible without departing from the scope thereof as defined in the appended claims.

What is claimed:

1. A word line selector for selecting word lines of an array of semiconductor memory cells formed in a doped semiconductor region of a semiconductor substrate, comprising a plurality of word line drivers responsive to word line selection signals, each word line driver being associated with a respective word line for driving the word line to prescribed word line electric potentials according to the word line selection signals, said word line electric potentials depending on an operation to be conducted on the array of memory cells, characterized in that a plurality of distinct doped semiconductor well structures is provided in the semiconductor substrate, each doped semiconductor well structure accommodating a respective group of at least one word line driver associated with a respective group of at least one word line.

2. The word line selector according to claim 1, further comprising a word line address decoder for decoding word line addresses identifying the word lines and accordingly controlling the word line selection signals.

3. The word line selector according to claim 2, further comprising doped semiconductor well structure biasing means for selectively biasing each doped semiconductor well structure to respective prescribed doped semiconductor well bias potentials, dependent on the operation to be conducted on the array of memory cells.

4. The word line selector according to claim 3, in which at least one word line in at least one word line group is selected during a memory cell erase operation.

5. The word line selector according to claim 4, in which in the erase operation:
the word line driver associated with the selected word line biases the selected word line to an erase word line potential;
the doped semiconductor well structure biasing means biases the doped semiconductor well structure accommodating the word line driver group associated with the group of word lines including the selected word line to a semiconductor well bias potential compatible with the erase word line potential;
the word line drivers associated with groups of word lines not including the selected word line bias the respective word lines (to an erase inhibition word line potential;
the semiconductor well structure biasing means biases the doped semiconductor well structures accommodating the word line driver groups associated with the groups of word lines not including the selected word line to a semiconductor well bias potential compatible with the erase inhibition word line potential.

6. The word line selector according to claim 5, in which in the erase operation of memory cells belonging to a selected word line the word line drivers associated with the non-selected word lines belonging to the same group of word lines as the selected word line bias the respective word lines to an intermediate word line potential intermediate between the erase potential and the erase inhibition potential, thereby the memory cells belonging to the non-selected word lines are not erased.

7. The word line selector according to claim 5, in which in the erase operation of memory cells belonging to a selected word line the word line drivers associated with the non-selected word lines belonging to the same group of word lines as the selected word line bias the respective word lines to the erase potential, thereby also the memory cells belonging to the non-selected word lines are erased.

8. The word line selector according to claim 1, in which each doped semiconductor well structure comprises at least one first doped semiconductor well of a first conductivity type formed in the semiconductor substrate, and at least one second doped semiconductor well (of a second conductivity type formed in the at least one first semiconductor well, the first and second semiconductor wells respectively accommodating first and second types of transistors of the word line drivers.

9. A semiconductor memory comprising at least one array of memory cells having a plurality of memory cell word lines, and word line selection means associated with the array for selecting the memory cell word lines, characterized in that the word line selection means include a word line selector according to claim 1.

10. The semiconductor memory according to claim 9, in which the array of memory cells includes dummy word lines of memory cells, at least one dummy word line being inserted between adjacent word line groups.

11. The semiconductor memory according to claim 9, in which the array of memory cells includes a plurality of logical memory sectors, each logical memory sector being formed by word lines of a same word line group.

12. The semiconductor memory according to claim 9, in which a plurality of electrically independent doped semiconductor regions are provided, each one accommodating a respective group of memory cells of the array, the doped semiconductor regions defining in each word line individually erasable word line portions.

13. A memory circuit, comprising:
a first plurality of semiconductor well structures that are electrically isolated from one and other; and
a plurality of word-line drivers each disposed in a respective one of the well structures.

14. The memory circuit of claim 13 wherein the plurality of word-line drivers comprises groups of word-line drivers, each group disposed in a respective one of the well structures.

15. The memory circuit of claim 13 wherein:
each of the well structures comprises a first well having a first conductivity and a second well having a second conductivity; and
each of the word-line drivers comprises a first transistor of a first type disposed in the second well and a second transistor of a second type disposed in the first well.

16. The memory circuit of claim 13 wherein:
each of the well structures comprises an N well and a P well disposed in the N well; and
each of the word-line drivers comprises a PMOS transistor disposed in the N well and an NMOS transistor disposed in the P well.

17. The memory circuit of claim 13, further comprising:
a plurality of word lines respectively coupled to the word-line drivers;
a plurality of nonvolatile memory cells respectively coupled to the word lines;
a bias circuit operable to provide a first set of voltages to a well structure that includes a word-line driver for a memory cell being erased and to provide a second set of voltages to the remaining well structures.

18. The memory circuit of claim 13, further comprising:
a plurality of word lines respectively coupled to the word-line drivers;
a plurality of nonvolatile memory cells respectively coupled to the word lines; and
a plurality of dummy word lines each disposed between a respective pair of adjacent word lines.

19. The memory circuit of claim 13, further comprising:
a second plurality of semiconductor well structures that are electrically isolated from one and other and from the first plurality of well structures; and
a plurality of memory cells each coupled to a respective word-line driver and disposed in a respective one of the second plurality of well structures.

20. A method for erasing a nonvolatile memory cell, the method comprising:

driving to a first voltage a first semiconductor well structure that includes a word-line driver for the memory cell; and
driving to a second voltage a second semiconductor well structure that includes a word-line driver for another memory cell.

21. The method of claim 20, further comprising:
driving to a third voltage a third semiconductor well structure that includes the memory cell; and
driving to a fourth voltage a fourth semiconductor well structure that includes the other memory cell.

22. A method for erasing a nonvolatile memory cell, the method comprising:
driving to a first voltage a first semiconductor region that includes a first transistor for driving the memory cell;
driving to a second voltage a second semiconductor region that includes a second transistor for driving the memory cell;
driving to a third voltage a third semiconductor region that includes a third transistor for driving another memory cell; and
driving to a fourth voltage a fourth semiconductor region that includes a fourth transistor for driving the other memory cell.

23. The method of claim 22 wherein:
the first semiconductor region comprises a first N region and the first transistor comprises a first PMOS transistor;
the second semiconductor region comprises a first P region disposed within the first N region and the second transistor comprises an first NMOS transistor;
the third semiconductor region comprises a second N region and the third transistor comprises a second PMOS transistor; and
the fourth semiconductor region comprises a second P region disposed within the second N region and the fourth transistor comprises a second NMOS transistor.

24. The method of claim 22 wherein:
the first voltage substantially comprises 0 volts, the first semiconductor region comprises a first N region and the first transistor comprises a first PMOS transistor;
the second voltage substantially comprises −9 volts, the second semiconductor region comprises a first P region disposed within the first N region and the second transistor comprises an first NMOS transistor;
the third voltage substantially comprises 5 volts, the third semiconductor region comprises a second N region and the third transistor comprises a second PMOS transistor; and
the fourth voltage substantially comprises 0 volts, the fourth semiconductor region comprises a second P region disposed within the second N region and the fourth transistor comprises a second NMOS transistor.

25. A method for erasing a first nonvolatile memory cell, the method comprising:
driving to a first voltage a first semiconductor region that includes a first transistor for driving the first memory cell and that includes a second transistor for driving a second memory cell in a same group as the first memory cell;
driving to a second voltage a second semiconductor region that includes a third transistor for driving the first memory cell and that includes a fourth transistor for driving the second memory cell;

driving to a third voltage a third semiconductor region that includes a fifth transistor for driving a third memory cell that is in a different group from the first memory cell;

driving to a fourth voltage a fourth semiconductor region that includes a sixth transistor for driving the third memory cell;

driving a gate of the first memory cell to a fifth voltage with the third transistor;

driving a gate of the second memory cell to a sixth voltage with the second transistor; and driving a gate of the third memory cell to a seventh voltage with the fifth transistor.

26. The method of claim 25 wherein:

the first voltage substantially comprises 0 volts, the first semiconductor region comprises a first N region and the first and second transistors comprises first and second PMOS transistors;

the second voltage substantially comprises −9 volts, the second semiconductor region comprises a first P region disposed within the first N region, and the third and fourth transistors comprise first and second NMOS transistors;

the third voltage substantially comprises 5 volts, the third semiconductor region comprises a second N region, and the fifth transistor comprises a third PMOS transistor;

the fourth voltage substantially comprises 0 volts, the fourth semiconductor region comprises a second P region disposed within the second N region, and the sixth transistor comprises a third NMOS transistor; and the fifth, sixth, and seventh voltages substantially comprise −8 volts, 0 volts, and 4.5 volts, respectively.

27. The method of claim 25 wherein:

the first semiconductor region comprises a continuous region between the first and second transistors; and the second semiconductor region comprises a continuous region between the third and fourth transistors.

28. The method of claim 25 wherein:

the first semiconductor region comprises a discontinuous region between the first and second transistors; and the second semiconductor region comprises a discontinuous region between the third and fourth transistors.

* * * * *

UNITED STATES PATENT AND TRADEMARK OFFICE
CERTIFICATE OF CORRECTION

PATENT NO. : 6,865,114 B2
DATED : March 8, 2005
INVENTOR(S) : Pio

It is certified that error appears in the above-identified patent and that said Letters Patent is hereby corrected as shown below:

Column 12,
Lines 34 and 61, "(" should be deleted.

Column 14,
Lines 33 and 47, "an" should be -- a --.

Signed and Sealed this

Twenty-eighth Day of June, 2005

JON W. DUDAS
*Director of the United States Patent and Trademark Office*